United States Patent
Moon et al.

(10) Patent No.: US 9,999,943 B2
(45) Date of Patent: Jun. 19, 2018

(54) METHOD OF MANUFACTURING A MASK

(71) Applicant: Samsung Display Co., Ltd., Yongin-si (KR)

(72) Inventors: Youngmin Moon, Yongin-si (KR); Sungsoon Im, Yongin-si (KR); Minho Moon, Yongin-si (KR); Soonchul Chang, Yongin-si (KR)

(73) Assignee: Samsung Display Co., LTd., Yongin-si (KR)

( * ) Notice: Subject to any disclaimer, the term of this patent is extended or adjusted under 35 U.S.C. 154(b) by 0 days. days.

(21) Appl. No.: 15/091,913

(22) Filed: Apr. 6, 2016

(65) Prior Publication Data

US 2017/0029957 A1    Feb. 2, 2017

(30) Foreign Application Priority Data

Jul. 31, 2015    (KR) .................. 10-2015-0108949

(51) Int. Cl.
| | |
|---|---|
| *H01L 21/302* | (2006.01) |
| *H01L 21/461* | (2006.01) |
| *C25F 3/00* | (2006.01) |
| *B23P 15/00* | (2006.01) |
| *C03C 25/00* | (2018.01) |
| *C23F 1/00* | (2006.01) |
| *C03C 15/00* | (2006.01) |
| *C03C 25/68* | (2006.01) |
| *B44C 1/22* | (2006.01) |
| *B23K 26/384* | (2014.01) |
| *B23K 26/00* | (2014.01) |
| *B23K 26/40* | (2014.01) |
| *C23C 14/04* | (2006.01) |
| *H01L 51/00* | (2006.01) |
| *B23K 103/18* | (2006.01) |

(52) U.S. Cl.
CPC ........ *B23K 26/384* (2015.10); *B23K 26/0093* (2013.01); *B23K 26/40* (2013.01); *C23C 14/042* (2013.01); *B23K 2203/26* (2015.10); *H01L 51/0011* (2013.01)

(58) Field of Classification Search
None
See application file for complete search history.

(56) References Cited

U.S. PATENT DOCUMENTS

| | | | | |
|---|---|---|---|---|
| 5,658,471 | A * | 8/1997 | Murthy | ........... B41J 2/1601 216/2 |
| 2002/0111035 | A1 * | 8/2002 | Atobe | .......... C23C 14/042 438/753 |
| 2006/0255316 | A1 * | 11/2006 | Kirby | ........... H01L 21/30608 252/79.1 |

(Continued)

FOREIGN PATENT DOCUMENTS

| | | |
|---|---|---|
| JP | 2009-041054 | 2/2009 |
| JP | 2014-148758 | 8/2014 |

(Continued)

*Primary Examiner* — Stephanie P Duclair
(74) *Attorney, Agent, or Firm* — H.C. Park & Associates, PLC (57) ABSTRACT

A method of manufacturing a mask includes forming a first hole in a base material using a laser, the first hole penetrating through the base material from a first surface to a second surface different than the first surface, and expanding the first hole using an etchant to form a second hole.

19 Claims, 4 Drawing Sheets

(56) References Cited

U.S. PATENT DOCUMENTS

| | | | | |
|---|---|---|---|---|
| 2010/0307809 A1* | 12/2010 | Noda | ............... | H05K 1/115 |
| | | | | 174/266 |
| 2010/0323526 A1* | 12/2010 | Kishimoto | ............ | B41J 2/1603 |
| | | | | 438/753 |
| 2011/0194262 A1* | 8/2011 | Naganuma | ........... | H05K 3/4691 |
| | | | | 361/749 |
| 2013/0089701 A1* | 4/2013 | Hooper | ................ | B23K 26/00 |
| | | | | 428/131 |
| 2014/0041923 A1* | 2/2014 | Hisada | .................. | H05K 1/115 |
| | | | | 174/266 |

FOREIGN PATENT DOCUMENTS

| | | |
|---|---|---|
| KR | 10-2005-0083421 | 8/2005 |
| KR | 10-2006-0043962 | 5/2006 |

\* cited by examiner

METHOD OF MANUFACTURING A MASK

CROSS-REFERENCE TO RELATED APPLICATION

This application claims priority from and the benefit of Korean Patent Application No. 10-2015-0108949, filed on Jul. 31, 2015, which is hereby incorporated by reference for all purposes as if fully set forth herein.

BACKGROUND

Field

Exemplary embodiments relate to a method. More particularly, exemplary embodiments relate to a method of manufacturing a mask.

Discussion of the Background

Mobile electronic devices, such as mobile phones, notebook personal computers, tablets, and the like, are widely used. To support various functions, mobile electronic devices typically include a display device that provides visual information, such as images, video, etc., to a user. Even though components for driving the display device are becoming smaller, a portion of the mobile electronic device dedicated to the display device is increasing. Further, a structure of the display device, which may bend at certain angles from a flat state, is being developed.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments provide a method of manufacturing a mask.

Additional aspects will be set forth in part in the description which follows and, in part, will be apparent from the description, or may be learned by practice of the inventive concept.

According to one or more exemplary embodiments, a method of manufacturing a mask includes: forming a first hole in a base material using a laser, the first hole penetrating through the base material from a first surface to a second surface different from the first surface; and expanding the first hole using an etchant to form a second hole.

According to one or more exemplary embodiments, a method of manufacturing a mask includes: causing, at least in part, a laser to form a first hole through a base material, the first hole extending from a first surface of the base material to a second surface of the base material; and causing, at least in part, an etchant to be supplied towards the first hole, the etchant being configured to expand a size of the first hole to form a second hole.

According to one or more exemplary embodiments, a system, method, computer program, or a combination thereof may be utilized to implement one or more of the exemplary embodiments described herein.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1A, 1B, 1C, and 1D are cross-sectional views of a mask at various stages of manufacture, according to one or more exemplary embodiments. Accordingly, a method of manufacturing a mask 110 will be described in association with FIGS. 1A through 1D.

Figure 1A:
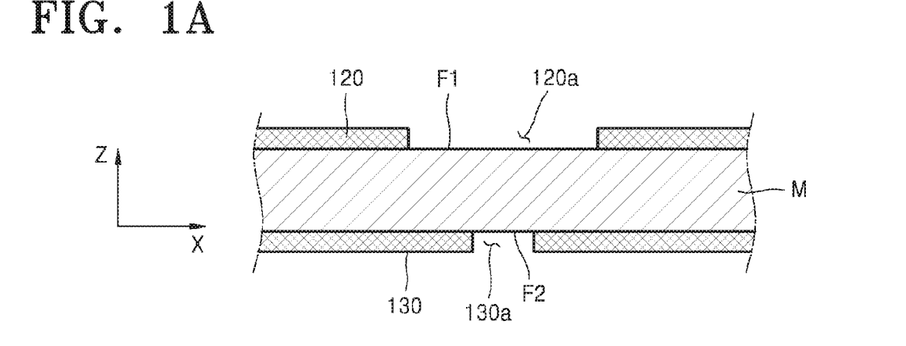
FIGS. 1A, 1B, 1C, and 1D are cross-sectional views of a mask at various stages of manufacture, according to one or more exemplary embodiments.
Figure 1B:
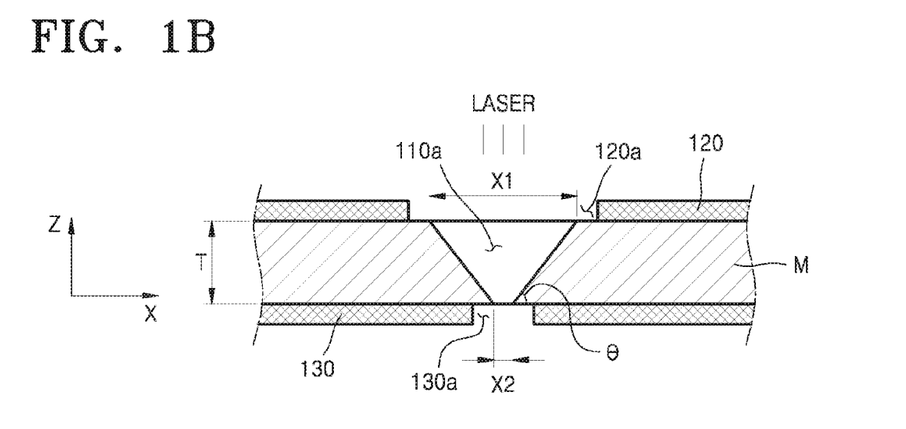
Figure 1C:
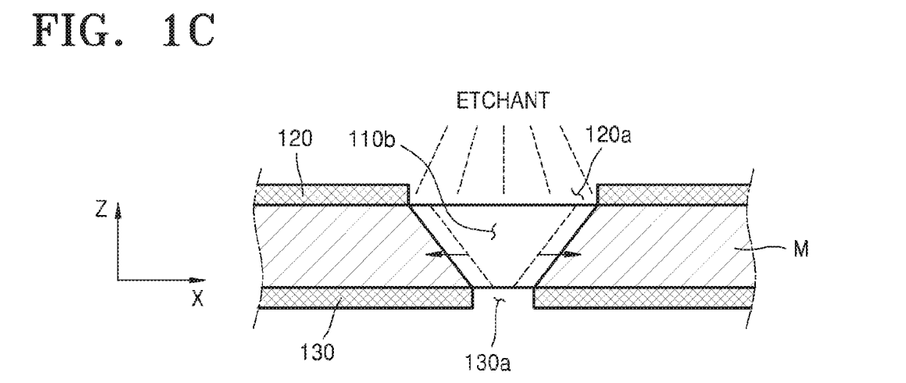
Figure 1D:
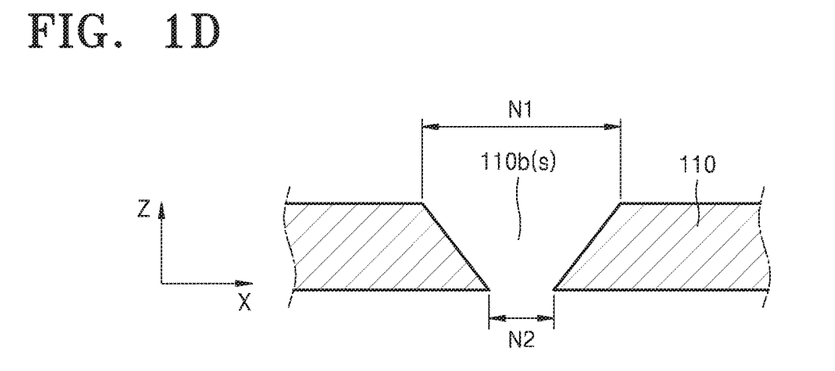
Figure 2:
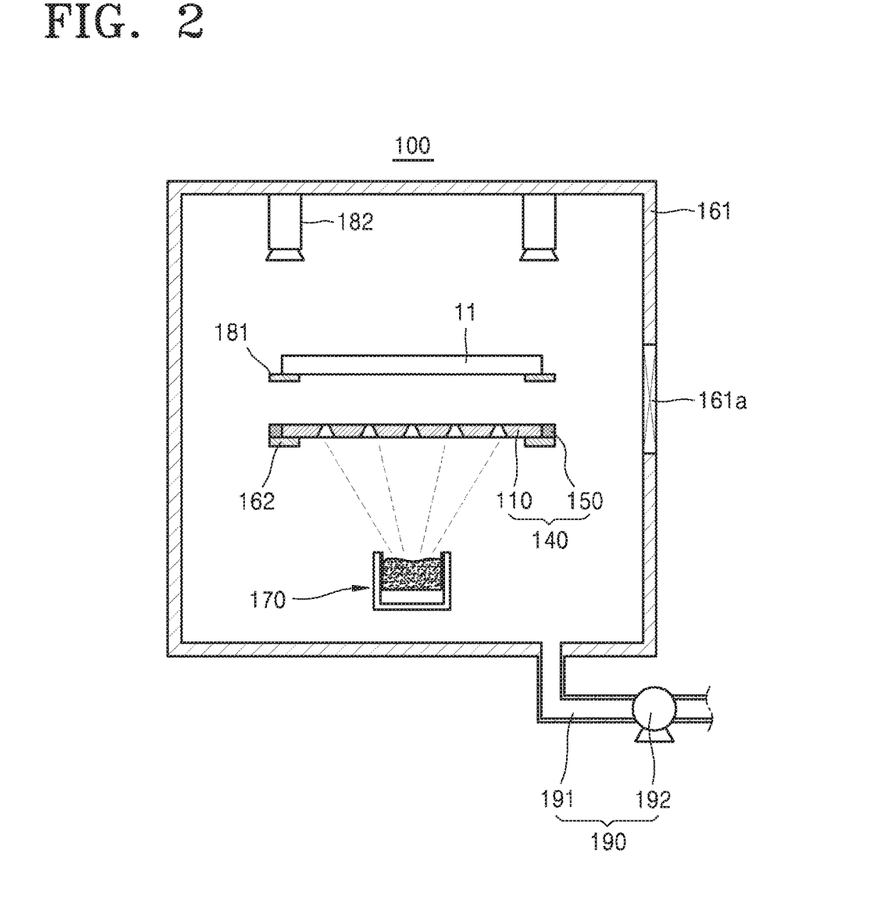
FIG. 2 is a conceptual diagram of manufacturing apparatus configured to manufacture a display device utilizing a mask manufactured according to the method of FIGS. 1A through 1D, according to one or more exemplary embodiments.

Referring to FIGS. 1A through 1D, the mask 110 may be manufactured by forming a slot 110b(s) having a pattern shape in a base material M. The base material M may include a nickel-iron alloy, e.g., an Invar (also known as FeNi36 or 64FeNi) material. It is contemplated, however, that any suitable material may be utilized in association with exemplary embodiments described herein. Here, a plurality of slots 110b(s) may be formed in a uniform pattern, as illustrated in FIG. 2. Also, a shape of the slot 110b(s) may vary based on design criteria and/or constraints. For example, the slot 110b(s) may have, in a plan view, an oval shape, a rectangular shape, a rhombus shape, a circular shape, and/or the like. For descriptive convenience, exemplary embodiments will be described in association with a slot 110b(s) having a circular shape.

A method of forming the slot 110b(s) will now be described in more detail. The base material M may be cut and prepared to be any suitable size. A first blocking film 120 may be formed on a first surface F1 of the base material M, and a second blocking film 130 may be formed on a second surface F2 of the base material M. The first blocking film 120 and the second blocking film 130 may respectively include a first opening 120a exposing a portion of the first surface F1 and a second opening 130a exposing a portion of the second surface F2. The first opening 120a and the second opening 130a may respectively have the same sizes (e.g., widths) as the sizes of the slot 110b(s) at the first surface F1 and the second surface F2. The first blocking film 120 and the second blocking film 130 may include any suitable etching-resistant material to block the effects of an etchant. For example, the first blocking film 120 and the second blocking film 130 may be a photoresist material.

After the first blocking film 120 and the second blocking film 130 are formed, a first hole 110a may be formed through the base material M by using a laser beam. The first hole 110a may penetrate the base material M from the first surface F1 to the second surface F2. The laser beam may be radiated through the first opening 120a and penetrate the base material M to pass through the second opening 130a. As such, a cross-sectional area of the first hole 110a, which is perpendicular to a thickness direction (or a Z-direction) of the base material M, may decrease from the first surface F1 to the second surface F2. The cross-sectional area of the first hole 110a, which is perpendicular to the thickness direction of the base material M, may linearly decrease from the first surface F1 to the second surface F2, however, any other suitable relationship may exist. Accordingly, a processed surface inside the base material M, where the first hole 110a is formed, may incline to form a tapered shape, e.g., an upside down trapezoidal shape.

According to one or more exemplary embodiments, the size of the first hole 110a, formed as described above, may be less than the size of the slot 110b(s). Also, a first linear distance X1 crossing the first hole 110a at the first surface F1 and a second linear distance X2 crossing the first hole 110a at the second surface F2 may satisfy the following equation:

$$X2 = X1 - 2*T/\tan(\theta) \qquad \text{Eq. 1}$$

Here, X1 denotes the first linear distance, X2 denotes the second linear distance, T denotes a thickness of a base material M, and θ denotes an inclined angle of the processed surface of the first hole 110a having a tapered shape. The value of X2 may be determined based on the values of X1 and θ. For example, the first linear distance X1 may be determined based on properties, such as a melting point, rigidity, and a material, of the base material M. The first linear distance X1 may be less than a linear distance N1 of the slot 110b(s) at the first surface F1 of base material M. In other words, by forming the first linear distance X1 to be at least less than the linear distance N1 of the slot 110b(s) formed at the first surface F1, a second hole 110b may be formed by later expanding the first hole 110a via one or more etching processes, as will become more apparent below. The first linear distance X1 may be arbitrarily selected within a range less than the linear distance N1 of the slot 110b(s) at the first surface F1, as described above. Also, the second linear distance X2 may be formed less than the linear distance N2 of the slot 110b(s) at the second surface F2. In this manner, the first hole 110a may have a smaller size than the slot 110b(s) to be ultimately formed.

After formation of the first hole 110a, the second hole 110b may be formed by supplying an etchant to at least one of the first opening 120a and the second opening 130a. The second hole 110b may have the same shape as the slot 110b(s). According to one or more exemplary embodiments, while the first hole 110a is being formed (or after formation of the first hole 110a), the etchant may be jetted on to the base material M. For instance, the etchant may be jetted on the base material M as a spray in a direction from the first surface F1 of the base material M towards the second surface F2. It is also contemplated that, the etchant may be simultaneously or sequentially jetted on the first surface F1 and the second surface F2 of the base material M. For descriptive convenience, exemplary embodiments are described in association with the etchant being jetted on the first surface F1 of the base material M.

When the etchant is jetted on the first surface F1 of the base material M, the etchant may flow into the first hole 110a. In this manner, the first blocking film 120, the first hole 110a, and the base material M around the first hole 110a through the first opening 120a, may be exposed to the etchant. As such, a region around the first hole 110a and a region inside the first hole 110a may be etched by contact of the etchant. That is, the etchant may etch a processed surface of the first hole 110a at the same or similar angle as an incline angle of the processed surface of the first hole 110a. Accordingly, the second hole 110b having the same or similar shape as the first hole 110a, but having a larger size than the first hole 110a, may be formed in the base material M. The processed surface inside the first hole 110a and the processed surface inside the second hole 110b may be parallel to each other. Also, when the second hole 110b is formed, an oxide formed on the processed surface (or an inner surface) of the first hole 110a may be removed.

According to one or more exemplary embodiments, the etching process described above may be performed until the second hole 110b becomes the size of slot 110b(s). A size of the second hole 110b at the first surface F1 is the same as a size of the first opening 120a, and a size of the second hole 110b at the second surface F2 is the same as a size of the second opening 130a. As such, when the second hole 110b is formed as described above, an etching speed may be adjusted so that the second hole 110b is formed to be the same size as the slot 110b(s).

When the second hole 110b is formed via the etching process as described above, an oxide generated while forming the first hole 110a may be removed. That is, when the first hole 110a is formed, an oxide may be formed due to a laser process on the processed surface of the first hole 110a, a region around the first hole 110a formed in the first surface F1, and a region around the first hole 110a formed in the second surface F2. The oxide may be removed via washing, but according to one or more exemplary embodiments, the oxide may be removed by the etchant while forming the second hole 110b.

It is also noted that, while forming the first hole 110a, some of a plurality of the first holes 110a may not be formed or may have an inaccurate shape due to contamination in a laser radiating apparatus or malfunction of the laser radiating apparatus. To this end, while forming the first hole 110a, the first hole 110a may include impurities. According to one or more exemplary embodiments, however, such situations may be solved (or at least reduced) by forming the second hole 110b. Accordingly, by using the aforementioned method, defects in the mask 110, which may be generated while manufacturing the mask 110, may be reduced. Also, according to exemplary embodiments described herein, since the oxide film generated while forming the first hole 110a via a laser beam is removed while forming the second hole 110b, a process for removing the oxide film is not separately required. When the mask 110 is manufactured using only a laser beam, an increase in manufacturing time is prevented. It is noted that use of just the laser beam may enable more precise processes.

Figure 3:
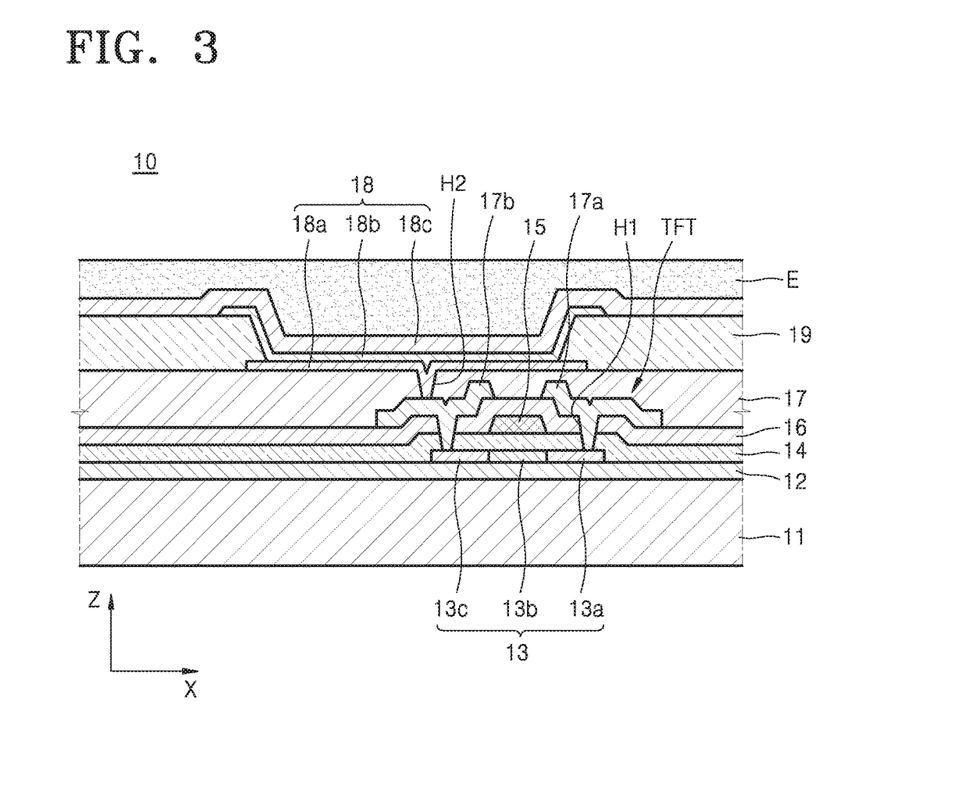
FIG. 3 is a cross-sectional view of a portion of a display device manufactured using the manufacturing apparatus of FIG. 2, according to one or more exemplary embodiments.
Figure 4A:
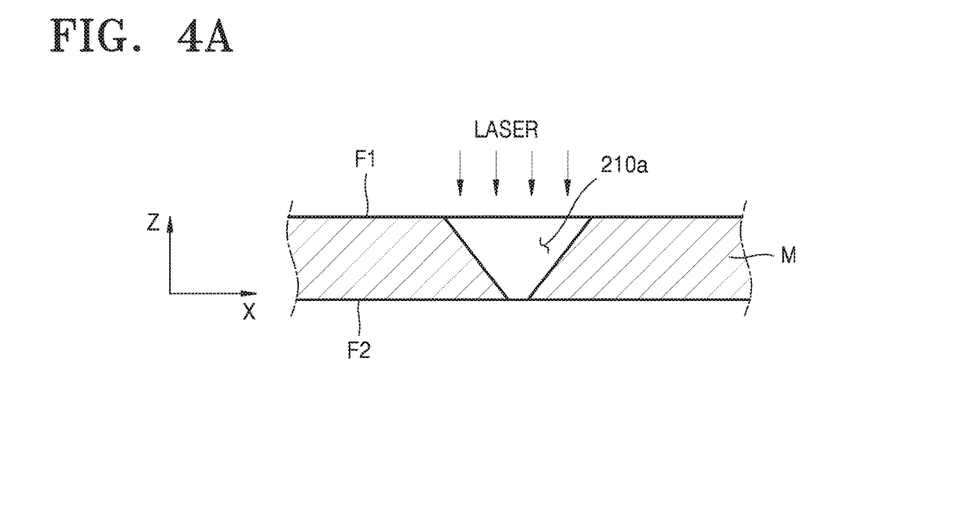
FIGS. 4A, 4B, 4C, and 4D are cross-sectional views of a mask at various stages of manufacture, according to one or more exemplary embodiments.
Figure 4B:
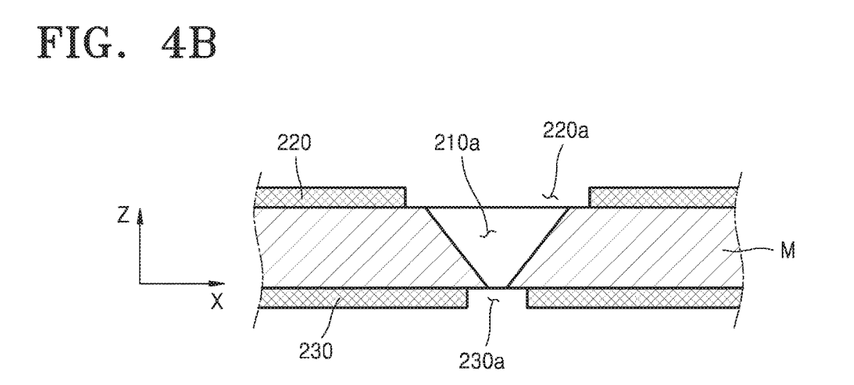
Figure 4C:
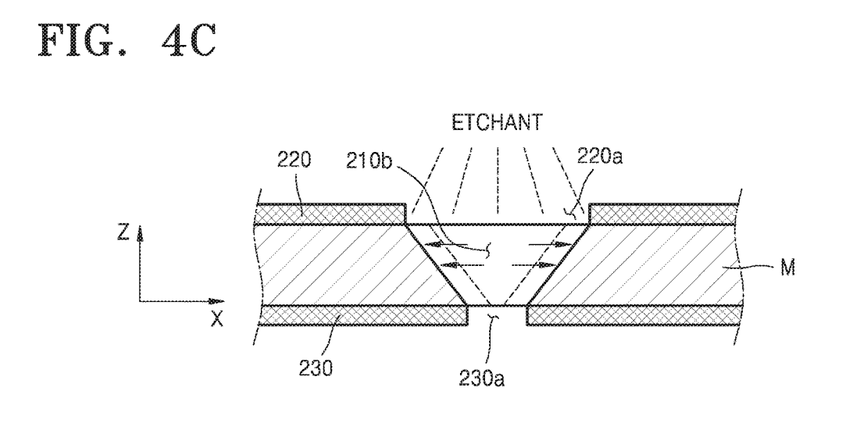
Figure 4D:
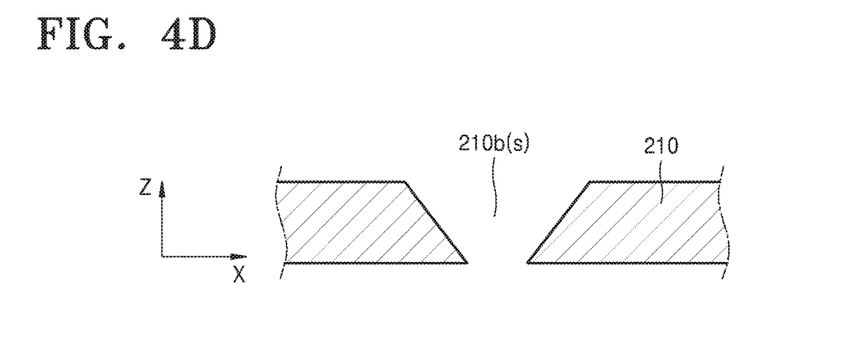

FIG. 2 is a conceptual diagram of manufacturing apparatus configured to manufacture a display device utilizing a mask manufactured according to the method of FIGS. 1A through 1D, according to one or more exemplary embodiments. FIG. 3 is a cross-sectional view of a portion of a display device manufactured using the manufacturing apparatus of FIG. 2, according to one or more exemplary embodiments.

Referring to FIGS. 2 and 3, the apparatus 100 for manufacturing a display device may include a chamber 161, a mask assembly 140, an accommodation unit 162, a deposition source 170, a substrate supporter 181, and a vision portion 182. The mask assembly 140 may include the mask 110 and a mask frame 150 where the mask 110 is accommodated and fixed. The mask 110 may be manufactured according to the method of FIGS. 1A through 1D.

A space may be formed inside the chamber 161, and a part of the space may be open. A gate valve 161a may be provided at the open part of the chamber 161 to open or close access to the open part of the chamber 161. The mask assembly 140 may be accommodated in the accommodation unit 162. It is noted that the accommodation unit 162 may be configured to rotate or linearly move the mask assembly 140. A deposition material may be inserted into the deposition source 170 and may be vaporized or sublimated. The vaporized or sublimated deposition material may be deposited on a first substrate 11 through the mask 110. The substrate supporter 181 may support the first substrate 11.

The apparatus 100 for manufacturing a display device may deposit the deposition material on the first substrate 11 while supporting the first substrate 11. According to one or more exemplary embodiments, the deposition material may be deposited on the first substrate 11 while moving the first substrate 11 and/or the deposition source 170 relative to the other. It is also contemplated that the mask assembly 140 may be moved relative to the first substrate 11 and/or the deposition source 170. For descriptive convenience, exemplary embodiments are described in association with the deposition material being deposited on the first substrate 11 while the first substrate 11 is supported in the chamber 161. A pressure adjuster 190 may be connected to the chamber 161. In this manner, the pressure adjuster 190 may include a connection pipe 191 connected to the chamber 161, and a pump 192 provided at the connection pipe 191 to pressurize (positively or negatively) an environment in the chamber 161.

According to one or more exemplary embodiments, the apparatus 100 for manufacturing a display device may be utilized to form an organic layer, an inorganic layer, or a metal layer of the display device. For descriptive convenience, exemplary embodiments are described in association with forming an organic layer of the display device. For instance, the apparatus 100 (including the mask 110) will be described in association with forming an intermediate layer 18b among organic layers of an organic light emitting display device.

For example, based on an operation of the apparatus 100, the first substrate 11 and the mask assembly 140 are inserted into the chamber 161, and are respectively supported by the substrate supporter 181 and the accommodation unit 162. Locations of the mask assembly 140 and the first substrate 11 are measured using the vision portion 182, and the first substrate 11 and the mask assembly 140 may be aligned by adjusting the accommodation unit 162. The vision portion 182 may include a camera configured to capture images of the mask assembly 140 and the first substrate 11, however, any suitable viewing mechanism may be utilized.

After aligning the locations of the mask assembly 140 and the first substrate 11 with each other, the deposition source 170 may be driven to vaporize or sublimate the deposition material. The deposition material may be deposited on the first substrate 11 through the slot 110b(s) formed in the mask 110. After the deposition material is deposited, the first substrate 11 may be removed from the chamber 161 for a next operation.

According to one or more exemplary embodiments, the apparatus 100 may form the intermediate layer 18b. Then, a counter electrode 18c may be formed on the intermediate layer 18b, and then a thin-film encapsulation layer E or a second substrate (not shown) may be provided on the counter electrode 18c to manufacture the display device 10.

As seen in FIG. 3, the display device 10 may include the first substrate 11 and an emission unit. Also, the display device 10 may include the thin-film encapsulation layer E or a second substrate, which is formed on the emission unit. Since the second substrate is the same as or similar to a substrate used in a general display device, details thereof are not provided herein. Also, for descriptive convenience, exemplary embodiments are described in association with the display device 10 including the thin-film encapsulation layer E.

The emission unit includes a thin-film transistor TFT. A passivation film 17 is formed on the thin-film transistor TFT, and an organic light emission device 18 may be formed on the passivation film 17. The first substrate 11 may include a glass material, but exemplary embodiments are not limited thereto. For instance, the first substrate 11 may include a plastic material, a metal material, such as stainless steel (SUS) or titanium (Ti), and/or the like. Also, the first substrate 11 may be formed from polyimide (PI). For descriptive convenience, exemplary embodiments are described in association with the first substrate 11 including a glass material.

A buffer layer 12 may be formed on a top surface of the first substrate 11. The buffer layer 12 may include an organic compound and/or an inorganic compound, such as, for instance, $SiO_x$ (x≥1) or $SiN_x$ (x≥1). An active layer 13 is formed on the buffer layer 12 according to a determined pattern. A gate insulating layer 14 is formed on the active layer 13, which includes a source region 13a, a drain region 13c, and a channel region 13b formed between the source region 13a and the drain region 13c.

The active layer 13 may include any suitable material. For example, the active layer 13 may include an inorganic semiconductor material, such as amorphous silicon, crystalline silicon, etc. As another example, the active layer 13 may include an oxide semiconductor, an organic semiconductor material, etc. For descriptive convenience, exemplary embodiments are described in association with the active layer 13 including amorphous silicon. For instance, the active layer 13 may be formed by forming an amorphous silicon film on the buffer layer 12, crystallizing the amorphous silicon to form a polycrystalline silicon film, and then patterning the polycrystalline silicon film. In the active layer 13, the source region 13a and the drain region 13c are doped with impurities according to a thin-film transistor TFT type, e.g., a driving thin-film transistor TFT (not shown) or a switching thin-film transistor TFT (not shown).

A gate electrode 15 corresponding to the active layer 13, and an interlayer insulating film 16 disposed on the gate electrode 15 are formed on a top surface of the gate insulating layer 14. Also, a contact hole H1 is formed through the interlayer insulating film 16 and the gate insulating layer 14. A source electrode 17a and a drain electrode 17b are formed on the interlayer insulating film 16 and respectively contact the source region 13a and the drain region 13c of the active layer 13.

The passivation film 17 is formed on the thin-film transistor TFT, and a pixel electrode 18a of an organic light-emitting device (OLED) 18 is formed on the passivation film 17. The pixel electrode 18a contacts the drain electrode 17b of the thin-film transistor TFT through a via hole H2 formed in the passivation film 17. The passivation film 17 may include an inorganic material and/or an organic material, and may be formed as a single layer or at least two layers. The passivation film 17 may be a planarization film, such that a top surface thereof is flat regardless of a curve of a bottom surface thereof, or may be formed according to a curve of the bottom surface. Also, the passivation film 17 may include a transparent insulating material, such that a resonance effect is obtained.

After forming the pixel electrode 18a on the passivation film 17, a pixel-defining film 19 formed of an organic material and/or an inorganic material is formed to cover the pixel electrode 18a and the passivation film 17. The pixel-defining film 19 is opened to partially expose the pixel electrode 18a. The intermediate layer 18b and the counter electrode 18c are formed on at least the pixel electrode 18a. The pixel electrode 18a operates as an anode and the counter electrode 18c operates as a cathode, or vice versa, of the OLED 18. The pixel electrode 18a and the counter electrode 18c are insulated from each other by the intermediate layer 18b, and an organic emission layer emits light as voltages of different polarities are applied to the intermediate layer 18b.

The intermediate layer 18b may include an organic emission layer. According to one or more exemplary embodiments, the intermediate layer 18b may include the organic emission layer, and may further include, as a common layer (not shown), at least one of a hole injection layer (HIL), a hole transport layer (HTL), an electron transport layer (ETL), and an electron injection layer (EIL). A pixel unit may include a plurality of sub-pixels, and the plurality of sub-pixels may emit light in various colors based on the applied voltages to the intermediate layer 18b. For example, the plurality of sub-pixels may include sub-pixels respectively configured to emit red, green, and blue lights, or respectively emitting red, green, blue, and white lights. It is contemplated, however, that the pixels/sub-pixels may be configured to emit any suitable color (or colors) of light.

The thin-film encapsulation layer E may include a plurality of inorganic layers or may include an inorganic layer and an organic layer. The organic layer of the thin-film encapsulation layer E may include polymer, and, for example, may be a single film or a stacked film formed of any one of polyethylene terephthalate, polyimide, polycarbonate, epoxy, polyethylene, and polyacrylate. For instance, the organic layer may include polyacrylate, and the polyacrylate may include a polymerized monomer compound including a diacrylate-based monomer and a triacrylate-based monomer. The polymerized monomer compound may further include a monoacrylate-based monomer. The polymerized monomer compound may further include a photoinitiator, such as 2,4,6-trimethylbenzoylposphineoxide (TPO), but exemplary embodiments are not limited thereto. The inorganic layer of the thin-film encapsulation layer E may be a single film or a stacked film including a metal oxide or a metal nitride. For example, the inorganic layer may include any one of silicon nitride ($SiN_x$) (x≥1), aluminum oxide ($Al_2O_3$), silicon oxide ($SiO_2$), and titanium oxide ($TiO_2$).

An uppermost layer of the thin-film encapsulation layer E may be an inorganic layer, which may prevent moisture permeation into the OLED 18. The thin-film encapsulation layer E may include at least one sandwich structure in which at least one organic layer is inserted between at least two inorganic layers. As another example, the thin-film encapsulation layer E may include at least one sandwich structure in which at least one inorganic layer is inserted between at least two organic layers. As yet a further example, the thin-film encapsulation layer E may include a sandwich structure in which at least one organic layer is inserted between at least two inorganic layers and a sandwich structure in which at least one inorganic layer is inserted between at least two organic layers.

According to one or more exemplary embodiments, the thin-film encapsulation layer E may include a first inorganic layer, a first organic layer, and a second inorganic layer sequentially from the top of the OLED 18. As another example, the thin-film encapsulation layer E may include a first inorganic layer, a first organic layer, a second inorganic layer, a second organic layer, and a third inorganic layer sequentially from the top of the OLED 18. As yet another example, the thin-film encapsulation layer E may include a first inorganic layer, a first organic layer, a second inorganic layer, a second organic layer, a third inorganic layer, a third organic layer, and a fourth inorganic layer sequentially from the top of the OLED 18.

A halogenated metal layer including lithium fluoride (LiF) may be further disposed between the OLED 18 and the first organic layer of the thin-film encapsulation layer E. The halogenated metal layer may prevent the OLED 18 from being damaged while forming the first inorganic layer via a sputtering method. The first organic layer may have a smaller area than the second inorganic layer, and the second organic layer may also have a smaller area than the third inorganic layer. Accordingly, the display device manufacturing apparatus 100 may form a precise pattern utilizing mask 110. Also, the display device 10 may realize a clear image.

FIGS. 4A, 4B, 4C, and 4D are cross-sectional views of a mask at various stages of manufacture, according to one or more exemplary embodiments.

Referring to FIGS. 4A through 4D, the mask 210 may be manufactured in a similar manner to the method of FIGS. 1A through 1D. For example, a first hole 210a may be formed by radiating a laser beam on the first surface F1 of the base material M prepared in an adequate size. A size of the first hole 210a may be a predetermined size, and, as such, intensity of the laser beam or a radiation time of the laser beam may be controlled to achieve the predetermined size. When the first hole 210a is formed in the base material M, the first hole 210a may penetrate through the base material M from the first surface F1 to the second surface F2. The first hole 210a may have a shape that is the same as or similar to that described with reference to FIGS. 1A through 1D.

After the first hole 210a is formed, a first blocking film 220 and a second blocking film 230 may be respectively formed on the first surface F1 and the second surface F2 of the base material M. Since the first blocking film 220 and the second blocking film 230 are the same as or similar to those described above with reference to FIGS. 1A through 1D, repetitive descriptions have been omitted to avoid obscuring exemplary embodiments described herein. A size of a first opening 220a formed in the first blocking film 220 may be larger than a size of the first hole 210a at the first surface F1. The size of the first opening 220a may be the same as the size of the slot 210b(s) at the first surface F1. For example, the size of the first opening 220a may be the same as a size of a second hole 210b at the first surface F1. A size of a second opening 230a formed in the second blocking film 230 may be larger than the size of the second hole 210b at the second surface F2. The size of the second opening 230a may be the same as the size of the slot 210b(s) at the second surface F2 or as the size of the first hole 210a at the second surface F2.

After the first blocking film 220 and the second blocking film 230 are formed, the second hole 210b may be formed by jetting an etchant towards the first surface F1 and/or the second surface F2. As described above, the size of the second hole 210b may be the same as the size of the first opening 220a at the first surface F1, and may be the same as the size of the second opening 230a at the second surface F2. The second hole 210b described above may become the slot 210b(s) of the mask 210. It is noted that a plurality of the slots 210b(s) may be used, and may have a uniform pattern. The first blocking film 220 and the second blocking film 230 may be removed after the second hole 210b is formed as described above.

According to one or more exemplary embodiments, defects in the mask 210, which may be generated while manufacturing the mask 210, may be reduced. Also, since an oxide film generated while forming the first hole 210a may be removed while forming the second hole 210b, a process for removing the oxide film is not additionally required, but may, nevertheless, be utilized. According to one or more exemplary embodiments, when the mask 210 is manufactured using only a laser beam, an increase in manufacturing time is prevented. It is noted that use of just the laser beam may enable more precise processes.

According to one or more exemplary embodiments, a mask may be formed with an elaborate pattern and with reduced impurities and/or imperfections.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a mask, the method comprising:
    forming a first blocking film on a first surface of a base material to resist an etchant, the first blocking film comprising a first opening exposing a portion of the first surface of the base material;
    forming a second blocking film on a second surface of the base material to resist the etchant, the second blocking film comprising a second opening exposing a portion of the second surface of the base material, the second opening being smaller than the first opening;
    irradiating, after formation of the second blocking film, the first surface of the base material through the first opening to form a first through hole in the base material using a laser, the first through hole penetrating through the base material from the first surface to the second surface different from the first surface; and
    expanding the first through hole using the etchant to form a second hole.

2. The method of claim 1, wherein a cross-sectional area of at least one of the first through hole and the second hole decreases from the first surface to the second surface.

3. The method of claim 1, wherein expanding the first through hole comprises removing an oxide formed on an inner surface of the first through hole.

4. The method of claim 1, wherein:
    a first linear distance crossing the first through hole at the first surface and a second linear distance crossing the first through hole at the second surface satisfy the following equation:

$X2 = X1 - 2*T/\tan(\theta)$; and

X1 denotes the first linear distance, X2 denotes the second linear distance, T denotes a thickness of the base material, and θ denotes an angle of the first through hole between the second surface and the first surface.

5. The method of claim 1, wherein the first through hole and the second hole comprise tapered surfaces.

6. The method of claim 5, wherein the tapered surfaces of the first through hole and the second hole are parallel to one another.

7. The method of claim 1, wherein the substrate is formed of a nickel-iron alloy.

8. The method of claim 1, wherein sizes of the first opening in the first blocking film and an opening of the second hole at the first surface of the base material are equivalent.

9. The method of claim 1, wherein a size of the first opening in the first blocking film is greater than a size of an opening of the first through hole at the first surface of the base material.

10. The method of claim 1, further comprising:
    removing the first blocking film from the first surface of the base material.

11. The method of claim 1, further comprising:
    removing the second blocking film from the second surface of the base material.

12. The method of claim 1, wherein the etchant is supplied to at least one of the first surface and the second surface.

13. The method of claim 1, wherein the etchant is jetted into the first through hole to form the second hole.

14. A method of manufacturing a mask, the method comprising:
    causing, at least in part, a laser to irradiate a first surface of a base material through a first opening in a first blocking film on the first surface of the base material to form a first through hole through the base material, the first through hole extending from the first surface of the base material to a second surface of the base material exposed by a second opening in a second blocking film on the second surface of the base material, the second opening being smaller than the first opening; and
    causing, at least in part, an etchant to be supplied towards the first through hole, the etchant being configured to expand a size of the first through hole to form a second hole, the first blocking film and the second blocking film being configured to resist an effect of the etchant.

15. The method of claim 14, wherein the second hole is concentrically aligned with the first through hole.

16. The method of claim 14, further comprising:
    causing, at least in part, the first blocking film to be formed on the first surface; and
    causing, at least in part, the second blocking film to be formed on the second surface,
    wherein the etchant is caused to be sprayed towards at least one of the first surface and the second surface to remove an oxide formed on an inner surface of the first through hole.

17. A method of manufacturing a mask, the method comprising:
    irradiating a first surface of a base material to form a first through hole in the base material using a laser, the first through hole penetrating through the base material from the first surface to a second surface different from the first surface;
    forming a first blocking film on the first surface of the base material to resist an etchant, the first blocking film comprising a first opening overlapping the first through hole in the first surface of the base material;
    forming a second blocking film on the second surface of the base material to resist the etchant, the second blocking film comprising a second opening overlapping the first through hole in the second surface of the base material; and
    supplying the etchant towards at least one of the first opening and the second opening, the etchant being configured to expand a size of the first through hole to form a second hole.

18. The method of claim 17, wherein the first opening of the first blocking film is bigger than the first through hole in the first surface of the base material.

19. The method of claim 17, wherein the second opening of the second blocking film is bigger than the first through hole in the second surface of the base material.

* * * * *